(12) United States Patent
Usuki et al.

(10) Patent No.: US 10,461,660 B2
(45) Date of Patent: Oct. 29, 2019

(54) CONTROL DEVICE OF POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Kazuhiro Usuki, Chuo (JP); Tomohisa Ohkami, Chuo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/090,336

(22) PCT Filed: Apr. 12, 2016

(86) PCT No.: PCT/JP2016/061829
§ 371 (c)(1),
(2) Date: Oct. 1, 2018

(87) PCT Pub. No.: WO2017/179127
PCT Pub. Date: Oct. 19, 2017

(65) Prior Publication Data
US 2019/0123660 A1    Apr. 25, 2019

(51) Int. Cl.
*H02M 7/48*    (2007.01)
*H02M 7/162*    (2006.01)
(Continued)

(52) U.S. Cl.
CPC .......... *H02M 7/1626* (2013.01); *H02M 1/08* (2013.01); *H02M 1/34* (2013.01); *H02M 7/155* (2013.01);
(Continued)

(58) Field of Classification Search
CPC .. H02M 2003/1552; H02M 1/12; H02M 1/42; H02M 1/4225; H02M 1/4233;
(Continued)

(56) References Cited

U.S. PATENT DOCUMENTS 5,446,647 A * 8/1995 Ikeda ................. H02M 1/4208
363/127
6,331,765 B1 * 12/2001 Yamamoto ................ G05F 1/70
323/210
(Continued)

FOREIGN PATENT DOCUMENTS

JP    48-86034    11/1973
JP    50-2854    1/1975
(Continued)

OTHER PUBLICATIONS

International Search Report dated Jul. 5, 2016 in PCT/JP2016/061829 filed Apr. 12, 2016.

*Primary Examiner* — Yusef A Ahmed
*Assistant Examiner* — Bryan R Perez
(74) *Attorney, Agent, or Firm* — Oblon, McClelland, Maier & Neustadt, L.L.P.

(57) ABSTRACT

A control device of a power converter includes first and second switching circuits. The device converts AC power supplied from an AC power supply into DC power, and supplies the DC power to the DC circuit. First converter arms are connected in series in the first switching circuit. Second converter arms are connected in series in the second switching circuit. The device further includes first and second control circuits connected to the first and the second switching circuits and control gate pulses of each of the first and the second arms respectively. A first and a second power interruption compensation circuits supply power to the first and the second control circuits for prescribed durations in
(Continued)

power interruptions of the first and the second control circuits respectively.

10 Claims, 7 Drawing Sheets

(51) Int. Cl.
    *H02M 1/08*     (2006.01)
    *H02M 7/155*     (2006.01)
    *H02M 1/34*     (2007.01)

(52) U.S. Cl.
    CPC ........ *H02M 7/48* (2013.01); *H02M 2001/348* (2013.01)

(58) Field of Classification Search
    CPC .. H02M 1/4241; H02M 1/4258; H02M 1/425; H02M 1/4208; H02M 2001/4283; G05F 1/70

See application file for complete search history.

(56) References Cited

U.S. PATENT DOCUMENTS

| | | | |
|---|---|---|---|
| 2015/0016155 A1* | 1/2015 | Lee | H02M 7/53875 |
| | | | 363/44 |
| 2016/0164413 A1 | 6/2016 | Akiyama | |

FOREIGN PATENT DOCUMENTS

| | | | |
|---|---|---|---|
| JP | 60-51469 | A | 3/1985 |
| JP | 4-344171 | A | 11/1992 |
| JP | 7-245953 | A | 9/1995 |
| JP | 2008-228147 | A | 9/2008 |
| WO | WO 2015/01562 | A1 | 2/2015 |

* cited by examiner

| FAILED CONTROL CIRCUIT | No. | BYPASS PAIR COMBINATIONS | | | |
|---|---|---|---|---|---|
| FIRST CONTROL CIRCUIT (FOR R-PHASE) | 1-1 | V1 | Y1 | V2 | Y2 |
| | 1-2 | | | W2 | Z2 |
| | 1-3 | W1 | Z1 | V2 | Y2 |
| | 1-4 | | | W2 | Z2 |
| SECOND CONTROL CIRCUIT (FOR S-PHASE) | 2-1 | U1 | X1 | U2 | X2 |
| | 2-2 | | | W2 | Z2 |
| | 2-3 | W1 | Z1 | U2 | X2 |
| | 2-4 | | | W2 | Z2 |
| THIRD CONTROL CIRCUIT (FOR T-PHASE) | 3-1 | U1 | X1 | U2 | X2 |
| | 3-2 | | | V2 | Y2 |
| | 3-3 | V1 | Y1 | U2 | X2 |
| | 3-4 | | | V2 | Y2 |

FIG. 8

CONTROL DEVICE OF POWER CONVERSION DEVICE

FIELD

Embodiments described herein relate generally to a control device of a power conversion device.

BACKGROUND ART

For example, a method called "GS (Gate Shift)-GB (Gate Block)-CBT (Circuit Breaker Trip)" is used for the protective stop of a separately-excited power conversion device using a thyristor element. In a direct current power transmission method such as HVDC (High Voltage Direct Current), etc., there are cases where the power conversion device is stopped using "GS-GB-CBT" when the control device generating the gate pulses fails. GS causes the power conversion device to operate in an inverter region by setting the trigger phase of the thyristor to be 90° or more. GB is the stopping of the gate pulses. CBT is the opening of a circuit breaker connected to the alternating current side of the power conversion device. "GS-GB-CBT" is the series of protective interlocking of performing GS, subsequently performing GB, and further performing CBT. Also, there is a method in which the protective stop is performed using BPP (bypass pairs) instead of GS. BPP causes the high-voltage-side arms and the low-voltage-side arms of the converter arms of the power converter that are connected to the same phase to conduct simultaneously.

Although the GS interval generally is about 40 ms to 100 ms, for example, when a failure occurs such as when a control power supply of a control device is lost, power interruption compensation is performed until the GS interval is completed. The power interruption compensation is performed to maintain the gate pulse generation ability of the control device so that the protective interlocking is completed for the power conversion device as an entirety. To this end, the control device of the power conversion device includes power interruption compensation circuits for a subdivided control circuit. For example, for the configuration of a twelve-phase power conversion device including twelve converter arms (valves), a control circuit that generates the gate pulse is provided for each arm of the twelve-phases. That is, a power interruption compensation circuit is provided for each phase of the twelve-phases. Therefore, the circuit configuration is complex; and the control device is larger. It is desirable to simplify the circuit configuration of such a control device.

PRIOR ART DOCUMENTS

Patent Literature

[Patent Literature 1]
JP-A S48-86034 (Kokai)
[Patent Literature 2]
JP-A 2008-228147 (Kokai)

SUMMARY OF INVENTION

Problem to be Solved by the Invention

An embodiment of the invention provides a control device of a power conversion device in which the circuit configuration can be simple.

Means for Solving the Problem

According to an embodiment of the invention, a control device of a separately-excited power conversion device is provided. The power conversion device includes a first switching circuit and a second switching circuit. Multiple first converter arms are connected in series in the first switching circuit. Multiple second converter arms are connected in series in the second switching circuit. One end of the first switching circuit and one end of the second switching circuit are connected to a high-voltage side of a direct current circuit. Another end of the first switching circuit and another end of the second switching circuit are connected to a low-voltage side of the direct current circuit. The power conversion device converts alternating current power supplied from an alternating current power supply into direct current power, and supplies the direct current power to the direct current circuit. The control device includes a first control circuit and a second control circuit. The first control circuit is connected to the first switching circuit and controls a gate pulse of each of the multiple first converter arms. The second control circuit is connected to the second switching circuit and controls a gate pulse of each of the multiple second converter arms. The first control circuit includes a first power interruption compensation circuit. The first power interruption compensation circuit supplies electrical power to the first control circuit for a prescribed amount of time in a power interruption of the first control circuit. The second control circuit includes a second power interruption compensation circuit. The second power interruption compensation circuit supplies electrical power to the second control circuit for a prescribed amount of time in a power interruption of the second control circuit.

Effects of the Invention

According to an embodiment of the invention, a control device of a power conversion device can be provided in which the circuit configuration can be simple.

BRIEF DESCRIPTION OF DRAWINGS

FIG. 8 is a figure illustrating combinations of bypass pairs according to the second embodiment.

DESCRIPTION OF EMBODIMENTS

Figure 1:
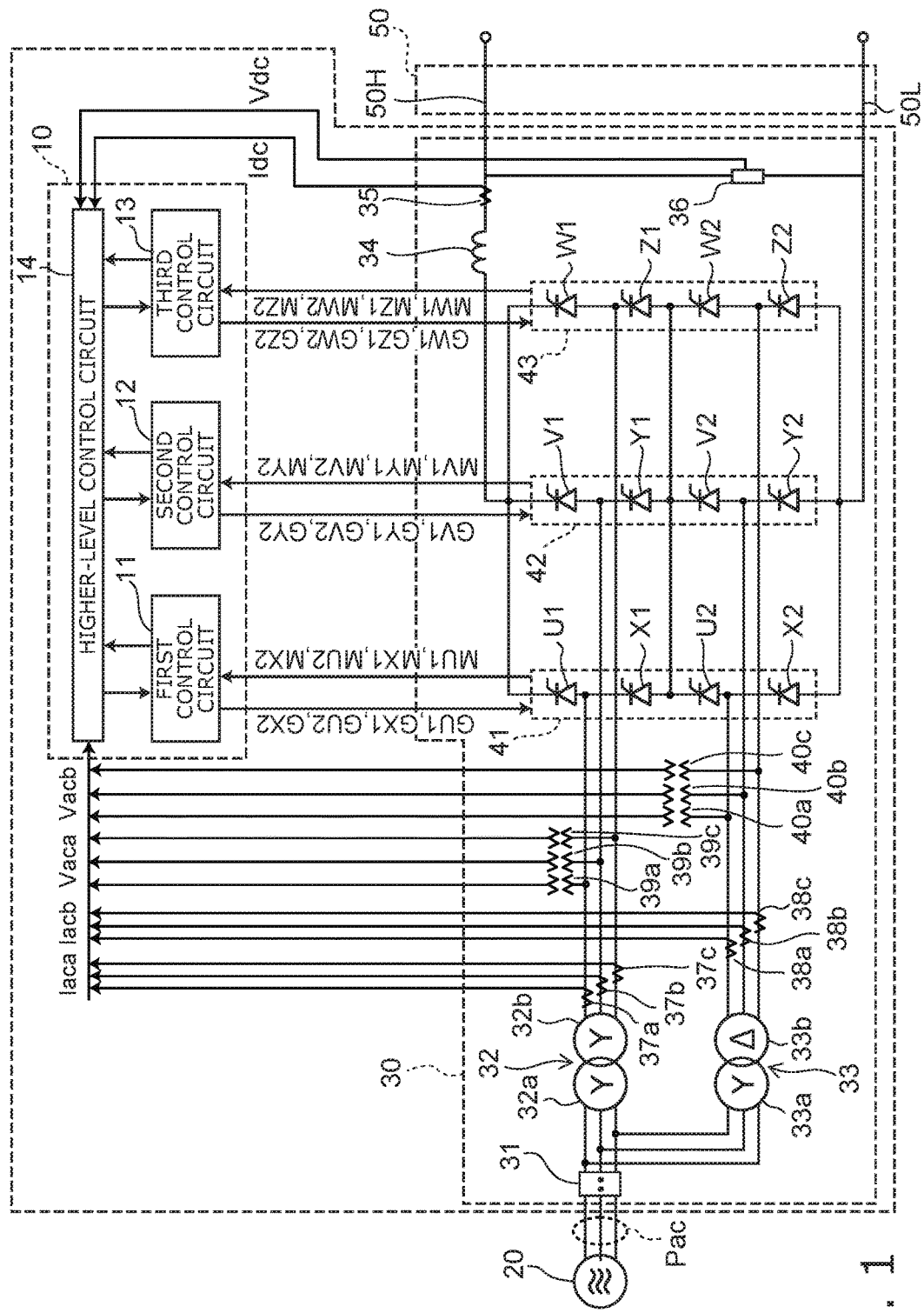
FIG. 1 is a block diagram schematically illustrating a control device and a major circuit portion of a power conversion device according to a first embodiment.

Embodiments of the present invention will be described below with reference to the drawings.

It is noted that the drawings are schematic or conceptual, and the relationship between the thickness and the width of each portion, the ratio of the sizes between the portions, and the like are not necessarily the same as the actual ones. Also, even in the case of representing the same part, the dimensions and ratios of the parts may be represented differently.

The identical portions in the drawings are given the same reference signs, and the detailed explanations thereof will be omitted. Different portions will be mainly described.

First Embodiment

FIG. 1 is a block diagram schematically illustrating a control device and a major circuit portion of a power conversion device according to a first embodiment.

As illustrated in FIG. 1, the control device 10 is connected to a major circuit portion 30 of the power conversion device (hereinbelow, called simply the major circuit portion 30). The major circuit portion 30 is connected to an alternating current power supply 20 and a direct current circuit 50. The alternating current power supply 20 is, for example, a three-phase alternating current power supply. The alternating current power supply 20 supplies a three-phase alternating current power Pac to the major circuit portion 30.

The major circuit portion 30 converts the alternating current power supplied from the alternating current power supply 20 into direct current power and supplies the direct current power to the direct current circuit 50. The major circuit portion 30 performs the conversion from the alternating current power into the direct current power. The major circuit portion 30 is separately-excited. The control device 10 controls the conversion of the electrical power by the major circuit portion 30.

The direct current circuit 50 includes a high-voltage-side direct current busbar 50H and a low-voltage-side direct current busbar 50L. The high-voltage-side direct current busbar 50H is, for example, a direct current cable such as a submarine cable, etc. The low-voltage-side direct current busbar 50L may be a cable return or may be an earth return, a sea return, etc. In other words, the low-voltage-side direct current busbar 50L is provided as necessary and is omissible.

For example, the major circuit portion 30 and the control device 10 are used in a direct current power transmission system. In the direct current power transmission system, the major circuit portion 30 is connected to one end of the direct current circuit 50; and a conversion device similar to the major circuit portion 30 is connected to the other end of the direct current circuit 50. In the direct current power transmission system, a conversion from alternating current power into direct current power is performed in the major circuit portion 30; and the direct current power is returned to alternating current power in the conversion device on the opposite side. Thus, in the direct current power transmission system, by converting alternating current power into direct current power, performing power transmission, and reconverting the direct current power into alternating current power, the alternating current power after reconverting is supplied to an electric power system, etc.

The major circuit portion 30 includes an alternating current circuit breaker 31, transformers 32 and 33, a direct current reactor 34, a first switching circuit 41, a second switching circuit 42, and a third switching circuit 43. For example, the first switching circuit 41, the second switching circuit 42, and the third switching circuit 43 respectively function as AC-DC converters of the R-phase, the S-phase, and the T-phase of three-phase alternating current. In the first switching circuit 41, multiple first converter arms U1, X1, U2, and X2 are connected in series. In the second switching circuit 42, multiple second converter arms V1, Y1, V2, and Y2 are connected in series. In the third switching circuit 43, multiple third converter arms W1, Z1, W2, and Z2 are connected in series. Here, one of the first to third converter arms also is called simply a valve (or a converter arm). That is, multiple valves (here, four valves or converter arms) are connected in series in one switching circuit.

One end of the first switching circuit 41, one end of the second switching circuit 42, and one end of the third switching circuit 43 are connected to the high-voltage side of the direct current circuit 50. The other end of the first switching circuit 41, the other end of the second switching circuit 42, and the other end of the third switching circuit 43 are connected to the low-voltage side of the direct current circuit 50.

The converter arms U1 and X1, the converter arms V1 and Y1, and the converter arms W1 and Z1 have a bridge connection. The converter arms U2 and X2, the converter arms V2 and Y2, and the converter arms W2 and Z2 have a bridge connection. Further, these two bridges have a cascade connection.

The alternating current circuit breaker 31 is provided between the alternating current power supply 20 and the major circuit portion 30. The alternating current circuit breaker 31 disconnects the alternating current power supply 20 and the major circuit portion 30.

The transformer 32 includes a primary winding 32a and a secondary winding 32b. The transformer 33 includes a primary winding 33a and a secondary winding 33b. The primary windings 32a and 33a of the transformers 32 and 33 each are connected to the alternating current power supply 20 via the alternating current circuit breaker 31. The secondary winding 32b of the transformer 32 is connected to the alternating current connection point between the converter arm U1 and the converter arm X1, the alternating current connection point between the converter arm V1 and the converter arm Y1, and the alternating current connection point between the converter arm W1 and the converter arm Z1. The secondary winding 33b of the transformer 33 is connected to the alternating current connection point between the converter arm U2 and the converter arm X2, the alternating current connection point between the converter arm V2 and the converter arm Y2, and the alternating current connection point between the converter arm W2 and the converter arm Z2. Thereby, the alternating current power that is transformed by the transformers 32 and 33 is supplied to each alternating current connection point of the first switching circuit 41, the second switching circuit 42, and the third switching circuit 43.

In the example, the transformers 32 and 33 are three-phase transformers. The primary winding 32a of the transformer 32 has a Y-connection. The secondary winding 32b of the transformer 32 has a Y-connection. The primary winding 33a of the transformer 33 has a Y-connection. The secondary winding 33b of the transformer 33 has a Δ-connection. Accordingly, the phases of the alternating current power supplied to the converter arms U2 and X2, the converter arms V2 and Y2, and the converter arms W2 and Z2 are shifted 30° with respect to the phases of the alternating current power supplied to the converter arms U1 and X1, the converter arms V1 and Y1, and the converter arms W1 and Z1. The three-phase transformer may be configured using three single-phase transformers. Or, the three-phase transformer may be a three-winding transformer having a tertiary winding.

The direct current output points on the high-voltage side of the first switching circuit 41, the second switching circuit 42, and the third switching circuit 43 are connected to the direct current reactor 34 and are connected to the high-voltage-side direct current busbar 50H of the direct current circuit 50 via the direct current reactor 34. The direct current output points on the low-voltage side of the first switching circuit 41, the second switching circuit 42, and the third switching circuit 43 are connected to the low-voltage-side direct current busbar 50L of the direct current circuit 50.

In the example, the major circuit portion 30 is a twelve-phase rectifying circuit. The major circuit portion 30 and the control device 10 convert the alternating current power supplied from the alternating current power supply 20 into the direct current power by controlling the switching of the first switching circuit 41, the second switching circuit 42, and the third switching circuit 43. The major circuit portion 30 applies a direct current voltage between the high-voltage-side direct current busbar 50H and the low-voltage-side direct current busbar 50L.

The major circuit portion 30 is not limited to a twelve-phase rectifying circuit and may be a six-phase rectifying circuit. Further, a multi-phase rectifying circuit such as twenty-four-phase, thirty-six-phase, forty-eight-phase, or the like may be used. Also, the alternating current power of the alternating current power supply 20 may be, for example, single-phase alternating current power.

The control device 10 according to the embodiment includes a first control circuit 11, a second control circuit 12, a third control circuit 13, and a higher-level control circuit 14. For example, the first control circuit 11 is for the R-phase. For example, the second control circuit 12 is for the S-phase. For example, the third control circuit 13 is for the T-phase. Gate pulses GU1, GX1, GU2, and GX2 are transmitted from the first control circuit 11 to the first switching circuit 41 via optical cables. The first control circuit 11 controls the gate pulses GU1, GX1, GU2, and GX2 respectively of the multiple converter arms U1, X1, U2, and X2 (the R-phase).

Also, valve monitor signals MU1, MX1, MU2, and MX2 that indicate whether a voltage is applied in the forward direction or whether a voltage is applied in the reverse direction to each valve are transmitted from each of the converter arms U1, X1, U2, and X2 to the first control circuit 11 via optical cables.

Gate pulses GV1, GY1, GV2, and GY2 are transmitted from the second control circuit 12 to the second switching circuit 42 via optical cables. The second control circuit 12 controls the gate pulses GV1, GY1, GV2, and GY2 respectively of the multiple converter arms V1, Y1, V2, and Y2 (the S-phase).

Also, valve monitor signals MV1, MY1, MV2, and MY2 that indicate whether a voltage is applied in the forward direction or whether a voltage is applied in the reverse direction to each valve are transmitted from each of the converter arms V1, Y1, V2, and Y2 to the second control circuit 12 via optical cables.

Gate pulses GW1, GZ1, GW2, and GZ2 are transmitted from the third control circuit 13 to the third switching circuit 43 via optical cables. The third control circuit 13 controls the gate pulses GW1, GZ1, GW2, and GZ2 respectively of the multiple converter arms W1, Z1, W2, and Z2 (the T-phase).

Also, valve monitor signals MW1, MZ1, MW2, and MZ2 that indicate whether a voltage is applied in the forward direction or whether a voltage is applied in the reverse direction to each valve are transmitted from each of the converter arms W1, Z1, W2, and Z2 to the third control circuit 13 via optical cables.

Figure 2:
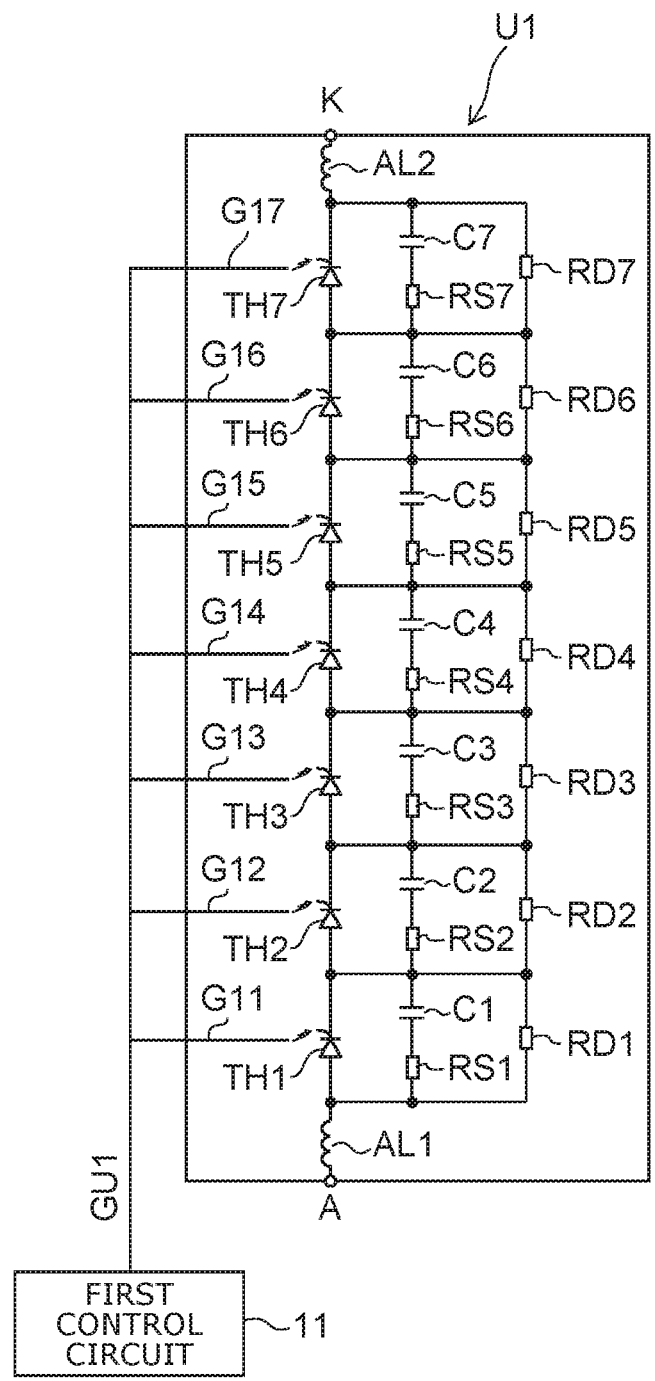
FIG. 2 is a block diagram schematically illustrating the first converter arm U1 according to the first embodiment.

FIG. 2 is a block diagram schematically illustrating the first converter arm U1 according to the first embodiment.

As illustrated in FIG. 2, the converter arm U1 includes, for example, multiple thyristors TH1 to TH7, multiple resistors RS1 to RS7, multiple condensers C1 to C7, multiple voltage-dividing resistors RD1 to RD7, and reactors AL1 and AL2. The first converter arm U1 includes a terminal K on the high-voltage side and a terminal A on the low-voltage side. The configurations of the other converter arms X1, U2, and X2, the converter arms V1, Y1, V2, and Y2, and the converter arms W1, Z1, W2, and Z2 are substantially the same as the configuration of the converter arm U1. A detailed description of these converter arms is omitted.

The thyristors TH1 to TH7 each are connected in series between the terminal K and the terminal A. In the example, seven thyristors TH1 to TH7 are connected in series. The number of thyristors may be seven or less, or may be eight or more. There may be one thyristor. It is sufficient for the number of thyristors connected in series to be appropriately set according to the applied voltage value, etc.

The reactor AL1 is connected to one end of the thyristors TH1 to TH7 connected in series. In the example, the reactor AL1 is connected between the terminal K and the cathode terminal of the thyristor TH7. The reactor AL2 is connected to the other end of the thyristors TH1 to TH7 connected in series. In the example, the reactor AL2 is connected between the terminal A and the anode terminal of the thyristor TH1. The circuit configuration, the connection position, etc., of the reactor, etc., are not limited to the example.

The resistor RS1 is connected in series with the condenser C1. The resistor RS1 and the condenser C1 are connected in parallel with the thyristor TH1. The resistor RS1 and the condenser C1 form a so-called snubber circuit for the thyristor TH1.

Similarly, a snubber circuit that includes the resistor RS2 and the condenser C2 is connected in parallel with the thyristor TH2. A snubber circuit that includes the resistor RS3 and the condenser C3 is connected in parallel with the thyristor TH3. A snubber circuit that includes the resistor RS4 and the condenser C4 is connected in parallel with the thyristor TH4. A snubber circuit that includes the resistor RS5 and the condenser C5 is connected in parallel with the thyristor TH5. A snubber circuit that includes the resistor RS6 and the condenser C6 is connected in parallel with the thyristor TH6. A snubber circuit that includes the resistor RS7 and the condenser C7 is connected in parallel with the thyristor TH7.

The voltage-dividing resistors RD1 to RD7 are respectively connected in parallel with the snubber circuits. The voltage-dividing resistors RD1 to RD7 each are voltage-dividing resistors of the direct current component. For example, the voltage-dividing resistors RD1 to RD7 also are used respectively as current-limiting resistors of a valve voltage sensing circuit (not illustrated) sensing the voltage in the forward direction or the reverse direction of the thyristors TH1 to TH7, etc. Although not illustrated in the drawing, the output of the valve voltage sensing circuit is transmitted to the first control circuit 11 as the valve monitor signal MU1 by using an optical cable, etc.

The thyristors TH1 to TH7 respectively include gate light guides G11 to G17 (optical fibers). The gate light guides G11 to G17 are optical cables that transmit the gate pulse GU1. The gate light guides G11 to G17 input the optical signal to the gates of the thyristors TH1 to TH7. The thyristors TH1 to TH7 each trigger (turn-on) according to the input of the optical signal. In other words, the thyristors TH1 to TH7 each are photo-thyristors.

The gate light guides G11 to G17 each are connected to the first control circuit 11. The first control circuit 11 inputs, as the gate pulse GU1, an optical signal having a pulse form to each of the gates of the thyristors TH1 to TH7 respectively via the gate light guides G11 to G17. Thereby, the thyristors TH1 to TH7 each are triggered. The first control circuit 11 inputs the optical signal having the pulse form substantially simultaneously to each of the thyristors TH1 to TH7. The thyristors TH1 to TH7 each are triggered substantially simultaneously. Thereby, the converter arm U1 is set to the on-state (the conducting state).

Thus, the first control circuit 11 controls the on-timing of the converter arm U1 by the input of the optical signal. The first control circuit 11 generates an optical signal which is a gate pulse for each of the converter arms U1, X1, U2, and X2 and controls the on-timing of each of the converter arms U1, X1, U2, and X2.

In the example, each of the thyristors TH1 to TH7 includes a photo-thyristor. Each of the thyristors TH1 to TH7 is not limited to a photo-thyristor and may be a thyristor that is triggered by inputting an electrical signal to the gate. Also, the switching element is not limited to a thyristor and may be another separately-excited switching element.

Although the converter arm U1 is described in FIG. 2, this is similar for the other converter arms X1, U2, and X2, the converter arms V1, Y1, V2, and Y2, and the converter arms W1, Z1, W2, and Z2 as well; therefore, a description and an illustration are omitted.

Further, as illustrated in FIG. 1, the major circuit portion 30 further includes a direct current sensor 35, a direct current voltage sensor 36, alternating current sensors 37a to 37c, alternating current sensors 38a to 38c, alternating current voltage sensors 39a to 39c, and alternating current voltage sensors 40a to 40c.

The direct current sensor 35 senses a direct current Idc output from the major circuit portion 30 and inputs the sensed value of the direct current Idc to the higher-level control circuit 14. The direct current voltage sensor 36 senses a direct current voltage Vdc output from the major circuit portion 30. The direct current voltage sensor 36 inputs the sensed value of the direct current voltage Vdc to the higher-level control circuit 14.

The alternating current sensors 37a to 37c sense an alternating current Iaca of each phase on the secondary side of the transformer 32 and input the sensed value of the alternating current Iaca to the higher-level control circuit 14. The alternating current sensors 38a to 38c sense an alternating current Iacb of each phase on the secondary side of the transformer 33 and input the sensed value of the alternating current Iacb to the higher-level control circuit 14.

The alternating current voltage sensors 39a to 39c sense an alternating current voltage Vaca of each phase on the secondary side of the transformer 32 and input the sensed value of the alternating current voltage Vaca to the higher-level control circuit 14. The alternating current voltage sensors 40a to 40c sense an alternating current voltage Vacb of each phase on the secondary side of the transformer 33 and input the sensed value of the alternating current voltage Vacb to the higher-level control circuit 14.

The alternating current sensors 37a to 37c and 38a to 38c may sense the alternating currents on the primary sides of the transformers 32 and 33. The alternating current voltage sensors 39a to 39c and 40a to 40c may sense the alternating current voltages on the primary sides of the transformers 32 and 33. For example, alternating current sensors that sense the alternating currents on the primary sides of the transformers 32 and 33, alternating current sensors that sense the alternating currents on the secondary sides of the transformers 32 and 33, alternating current voltage sensors that sense the alternating current voltages on the primary sides of the transformers 32 and 33, and alternating current voltage sensors that sense the alternating current voltages on the secondary sides of the transformers 32 and 33 each may be provided.

Figure 3:
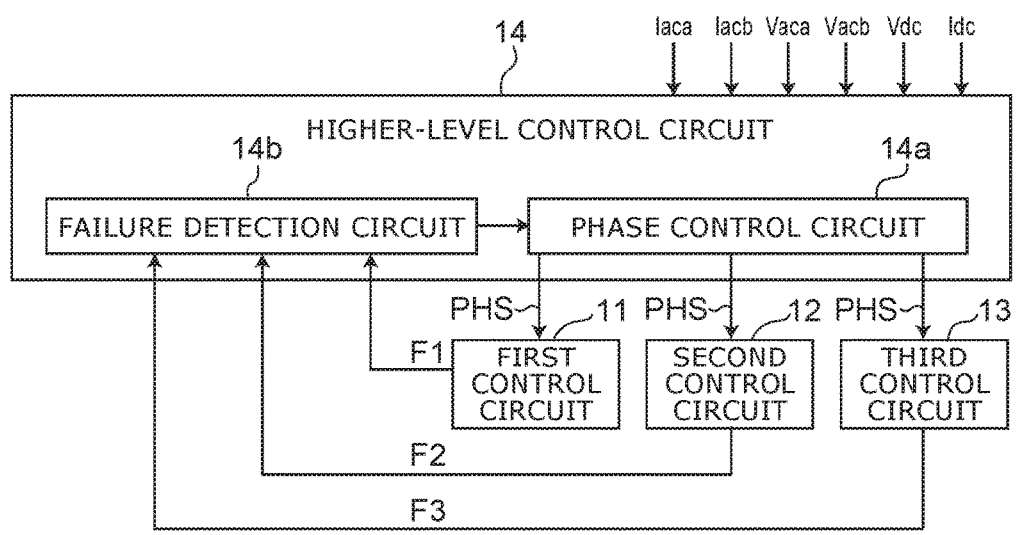
FIG. 3 is a block diagram schematically illustrating the higher-level control circuit according to the first embodiment.

FIG. 3 is a block diagram schematically illustrating the higher-level control circuit according to the first embodiment.

As illustrated in FIG. 3, the higher-level control circuit 14 is connected to each of the first control circuit 11, the second control circuit 12, and the third control circuit 13. The higher-level control circuit 14 may be configured as a separate body from the first to third control circuits 11 to 13. In other words, the higher-level control circuit 14 may be connected to each of the first to third control circuits 11 to 13 via a wired or wireless method.

Based on a start command or a stop command, a direct current power command value, a direct current command value, a direct current voltage command value, etc., that are not illustrated and based on each input sensed value of the alternating current Iaca and Iacb, the alternating current voltages Vaca and Vacb, the direct current Idc, and the direct current voltage Vdc, the higher-level control circuit 14 outputs, to each of the first control circuit 11, the second control circuit 12, and the third control circuit 13, a command (a phase control pulse PHS) corresponding to the conduction interval corresponding to these values for each of the converter arms U1, X1, U2, and X2, each of the converter arms V1, Y1, V2, and Y2, and each of the converter arms W1, Z1, W2, and Z2.

The higher-level control circuit 14 includes a phase control circuit 14a and a failure detection circuit 14b. The phase control circuit 14a generates the phase control pulses PHS recited above and outputs the generated phase control pulses PHS respectively to the first to third control circuits 11 to 13. In the case where failure occurs, the first to third control circuits 11 to 13 transmit failure signals F1 to F3 of each of the control circuits to the failure detection circuit 14b. The failure detection circuit 14b has the function of monitoring the operating states of the first to third control circuits 11 to 13 and determining whether or not a failure has occurred in the first to third control circuits 11 to 13. The phase control circuit 14a is connected to the failure detection circuit 14b and can output the phase control pulses PHS according to the occurrence of the failure of the first to third control circuits 11 to 13.

Figure 4:
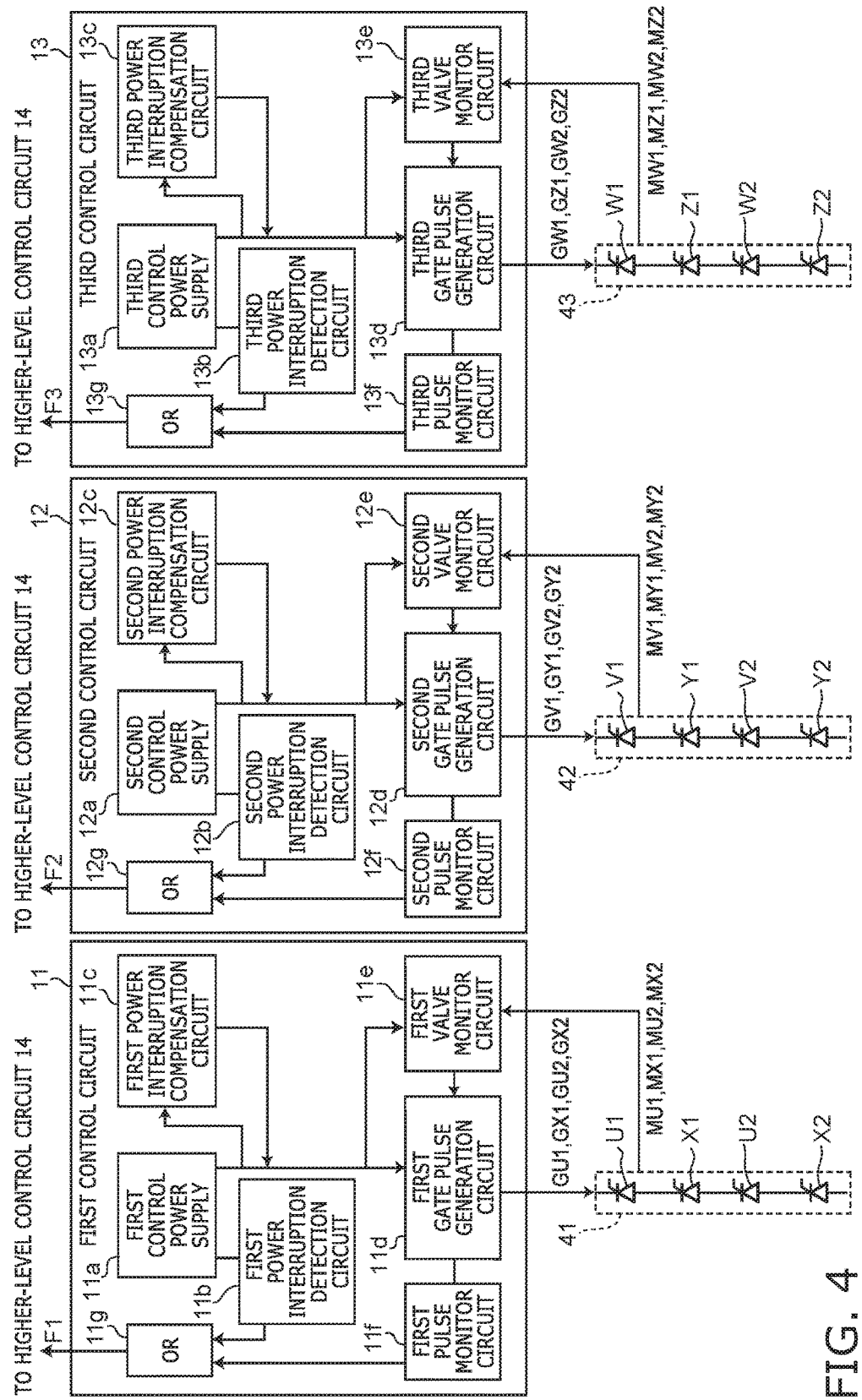
FIG. 4 is a block diagram schematically illustrating the first to third control circuits according to the first embodiment.

FIG. 4 is a block diagram schematically illustrating the first to third control circuits according to the first embodiment.

As illustrated in FIG. 4, the first control circuit 11 includes a first control power supply 11a, a first power interruption detection circuit 11b, a first power interruption compensation circuit 11c, a first gate pulse generation circuit 11d, a first valve monitor circuit 11e, a first pulse monitor circuit 11f, and a first OR circuit 11g. The first power interruption detection circuit 11b, the first pulse monitor circuit 11f, and the first OR circuit 11g are included in a first abnormality detection circuit that senses the abnormality of the first control circuit 11.

The first control power supply 11a supplies a power supply to the first gate pulse generation circuit 11d and the first valve monitor circuit 11e. The first power interruption detection circuit 11b monitors the state of the first control power supply 11a and, for example, in the case where the first control power supply 11a fails and it is determined that the output voltage of the first control power supply 11a is zero or not more than a threshold, it is determined that the first control circuit 11 is in a power interruption state. The first power interruption compensation circuit 11c supplies electrical power to the first gate pulse generation circuit 11d and the first valve monitor circuit 11e for a prescribed amount of time in a power interruption of the first control circuit 11. The first power interruption compensation circuit 11c includes, for example, a battery, a condenser, etc.

The valve monitor signals MU1, MX1, MU2, and MX2 which are the output from the valve voltage sensing circuits not illustrated in FIG. 2 are output respectively from the converter arms U1, X1, U2, and X2 included in the first switching circuit 41. The first valve monitor circuit 11e receives the valve monitor signals MU1, MX1, MU2, and MX2 from the first switching circuit 41, determines whether the voltages applied to the converter arms U1, X1, U2, and X2 of the first switching circuit 41 are forward voltages or reverse voltages based on the signals, and transmits a signal of the determination to the first gate pulse generation circuit 11d.

The first gate pulse generation circuit 11d generates the gate pulses GU1, GX1, GU2, and GX2 to be applied to the first switching circuit 41 based on the command (the phase control pulse) from the higher-level control circuit 14 and the determination result (forward voltage or reverse voltage) from the first valve monitor circuit 11e.

When the first power interruption detection circuit 11b determines that the first control circuit 11 is in a power interruption state, the output of the determination is output to the first OR circuit 11g.

The first pulse monitor circuit 11f monitors the existence or absence of the abnormality of the first gate pulse generation circuit 11d. For example, the first pulse monitor circuit 11f determines, for the gate pulses GU1, GX1, GU2, and GX2 which are the output of the first gate pulse generation circuit 11d, that the first gate pulse generation circuit 11d is abnormal in the case of a pulse width abnormality in which the pulse width is not within a prescribed value, in the case of a pulse number abnormality in which the number of pulses inside one cycle is larger than a prescribed value, in the case of an open phase in which a pulse is not output for a prescribed interval, or in the case of insufficient output in which the value of the output of the pulse insufficient for a prescribed value. For example, the value of the pulse output is a voltage value when the pulse output is a voltage signal, and is a light amount value when the pulse output is an optical signal.

When the first power interruption detection circuit 11b determines that the first control circuit 11 is in a power interruption state, the first power interruption detection circuit 11b outputs the output of the determination as an abnormality signal to the first OR circuit 11g. When the first pulse monitor circuit 11f determines that the first gate pulse generation circuit 11d is abnormal, the first pulse monitor circuit 11f outputs the output of the determination as an abnormality signal to the first OR circuit 11g. In the case where the first OR circuit 11g receives either one of the abnormality signal from the first power interruption detection circuit 11b or the abnormality signal from the first pulse monitor circuit 11f, the first OR circuit 11g outputs a failure signal F1 of the first control circuit 11 to the higher-level control circuit 14.

The second control circuit 12 includes a second control power supply 12a, a second power interruption detection circuit 12b, a second power interruption compensation circuit 12c, a second gate pulse generation circuit 12d, a second valve monitor circuit 12e, a second pulse monitor circuit 12f, and a second OR circuit 12g. The second power interruption detection circuit 12b, the second pulse monitor circuit 12f, and the second OR circuit 12g are included in a second abnormality detection circuit that senses the abnormality of the second control circuit 12.

The operations of the second control power supply 12a, the second power interruption detection circuit 12b, the second power interruption compensation circuit 12c, the second gate pulse generation circuit 12d, the second valve monitor circuit 12e, the second pulse monitor circuit 12f, and the second OR circuit 12g included in the second control circuit 12 are similar to the operations of the first control power supply 11a, the first power interruption detection circuit 11b, the first power interruption compensation circuit 11c, the first gate pulse generation circuit 11d, the first valve monitor circuit 11e, the first pulse monitor circuit 11f, and the first OR circuit 11g included in the first control circuit 11. A repeated description is omitted here.

The third control circuit 13 includes a third control power supply 13a, a third power interruption detection circuit 13b, a third power interruption compensation circuit 13c, a third gate pulse generation circuit 13d, a third valve monitor circuit 13e, a third pulse monitor circuit 13f, and a third OR circuit 13g. The third power interruption detection circuit 13b, the third pulse monitor circuit 13f, and the third OR circuit 13g are included in a third abnormality detection circuit that senses the abnormality of the third control circuit 13.

The operations of the third control power supply 13a, the third power interruption detection circuit 13b, the third power interruption compensation circuit 13c, the third gate pulse generation circuit 13d, the third valve monitor circuit 13e, the third pulse monitor circuit 13f, and the third OR circuit 13g included in the third control circuit 13 are similar to the operations of the first control power supply 11a, the first power interruption detection circuit 11b, the first power interruption compensation circuit 11c, the first gate pulse generation circuit 11d, the first valve monitor circuit 11e, the first pulse monitor circuit 11f, and the first OR circuit 11g included in the first control circuit 11. A repeated description is omitted here.

Although a configuration that includes the power interruption compensation circuit inside each of the control circuits is used in the embodiment, a configuration that includes the power interruption compensation circuits outside the control circuits may be used.

Thus, the control device of the power conversion device according to the embodiment includes one control circuit per set of the multiple converter arms (the multiple valves) connected in series and further includes a power interruption compensation circuit for each of the combined control circuits. In other words, the power interruption compensation circuits are combined and provided for each of the control circuits. Thereby, the circuit configuration of the control device can be simple.

Further, in a power conversion device having a large capacity, the first switching circuit (the R-phase), the second switching circuit (the S-phase), and the third switching circuit (the T-phase) may be separated from each other for insulation. Therefore, in the power conversion device, by providing the control circuits to be physically subdivided for each of the first switching circuit (the R-phase), the second switching circuit (the S-phase), and the third switching circuit (the T-phase), it is possible to dispose the control circuit individually proximal to each switching circuit of the R-phase, the S-phase, and the T-phase. Therefore, the total length of the optical cables used between the AC-DC converter and the control circuit can be shortened.

Further, by providing the control circuit for each of the R-phase, the S-phase, and the T-phase, the maintenance unit can be minimized; and by subdividing the maintenance time to be short, a reduction of the maintenance time can be realized.

The embodiment is described by illustrating three switching circuits and three control circuits in the case of three-phase alternating current. As the embodiment, it is sufficient for at least two switching circuits to be connected in parallel to the direct current circuit, and for two control circuits corresponding to the two switching circuits to be included. For example, in the case where a full-bridge rectifying circuit is used for single-phase alternating current, two switching circuits are provided; and two control circuits that correspond to the two switching circuits are provided.

Here, the control device 10 has a function of safely causing a protective stop of the power conversion device when at least one of the first to third control circuits 11 to 13 has a power interruption. Specifically, the protective stop is performed not by a gate shift (GS) operation but by a bypass pair (BPP) operation. The bypass pair operation refers to the operation of causing the high-voltage-side valves and the low-voltage-side valves connected to the same phase of the valves of the AC-DC converter to conduct simultaneously. In the case of the first switching circuit 41, for example, U1 and X1 are a bypass pair; and U2 and X2 are a bypass pair.

Figure 5:
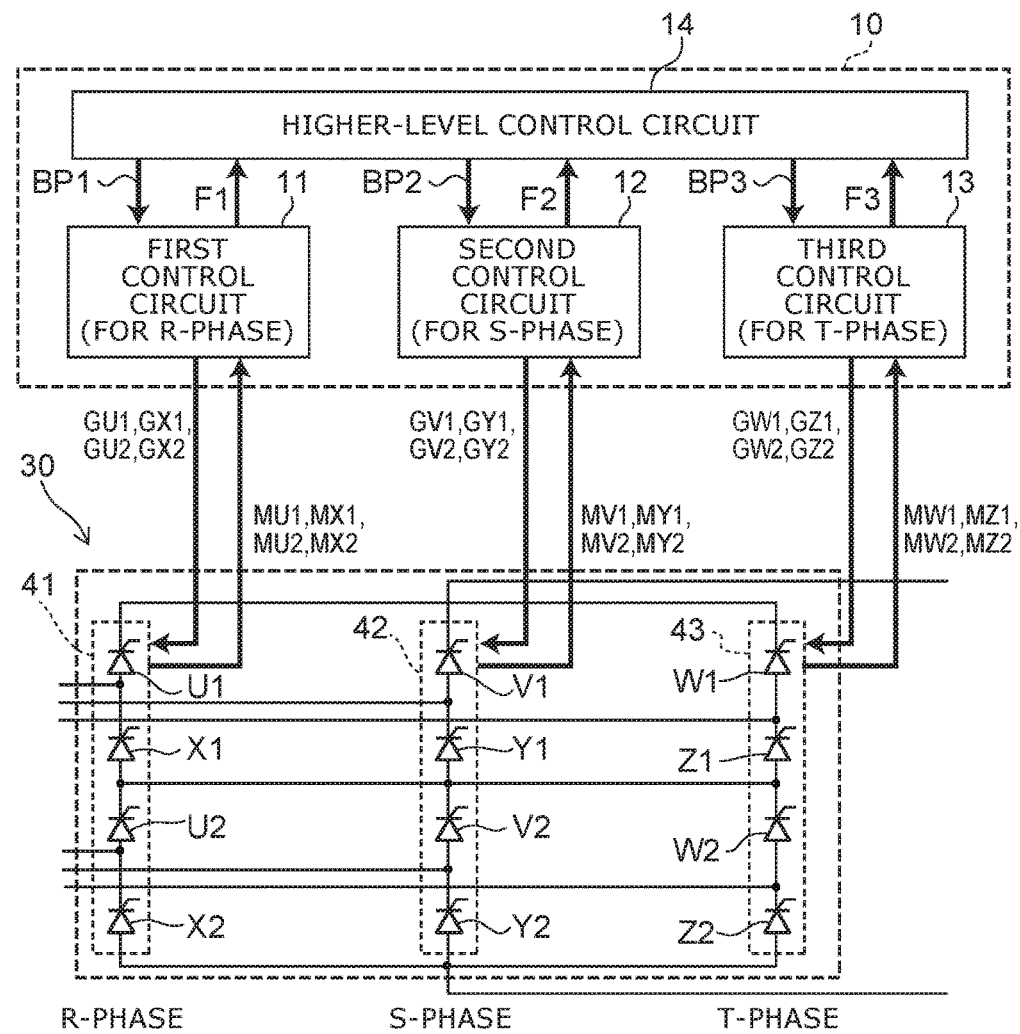
FIG. 5 is a block diagram schematically illustrating a portion of the control device of the major circuit portion of the power conversion device according to the first embodiment.

FIG. 5 is a block diagram schematically illustrating a portion of the control device of the major circuit portion of the power conversion device according to the first embodiment.

The protective stop operation that uses the bypass pairs according to the embodiment will now be described based on FIG. 4 and FIG. 5.

In FIG. 4 and FIG. 5, for example, it is assumed that the first control power supply 11a of the first control circuit 11 fails; and the first control circuit 11 has a power interruption. When the first control circuit 11 has a power interruption, inside the first control circuit 11, the power supply is supplied from the first power interruption compensation circuit 11c; and the electrical power is supplied from the first power interruption compensation circuit 11c for a prescribed amount of time. The failure of the first control power supply 11a (the occurrence of the power interruption inside the first control circuit 11) is sensed by the first power interruption detection circuit 11b and is notified as the failure signal F1 from the first control circuit 11 to the higher-level control circuit 14 via the first OR circuit 11g.

The higher-level control circuit 14 that receives the notification immediately outputs a bypass pair command to one control circuit other than the first control circuit 11. Also, the output of the phase control pulse PHS is stopped for the first control circuit 11 and the control circuit to which the bypass pair command is not output.

For example, the higher-level control circuit 14 outputs, to the second control circuit 12, a bypass pair command BP2 that sets the multiple converter arms V1, Y1, V2, and Y2 to the bypass pair state; and the higher-level control circuit 14 stops the output of the phase control pulses PHS to the first control circuit 11 and the third control circuit 13.

According to the bypass pair command BP2, the second control circuit 12 outputs the gate pulses GV1, GY1, GV2, and GY2 respectively to the converter arms V1, Y1, V2, and Y2 included in the second switching circuit 42. The gate pulses GV1, GY1, GV2, and GY2 each are output by the second gate pulse generation circuit 12d. Here, although the bypass pair command BP2 is output from the higher-level control circuit 14 to the second control circuit 12 to set the converter arms V1, Y1, V2, and Y2 to the bypass pair state, logic may be included in the higher-level control circuit 14 and the second control circuit 12 such that the gate pulses GV1, GY1, GV2, and GY2 are output respectively so that the converter arms V1, Y1, V2, and Y2 are set to the bypass pair state by using the phase control signal PHS output from the higher-level control circuit 14 to the second control circuit 12.

For the prescribed amount of time, i.e., the power interruption compensation time that the electrical power is supplied from the first power interruption compensation circuit 11c to the first control circuit 11 when the first control circuit 11 has the power interruption, it is sufficient to ensure a time that is not less than the time from when the bypass pair command BP2 is output until the other converter arms (e.g., U1, X1, U2, X2, W1, Z1, W2, Z2, etc.) to which the bypass pair command BP2 is not applied turn off correctly. Due to the power interruption, the gate pulse generation function of the first gate pulse generation circuit 11d of the first control circuit 11 is lost. This is because at this time, in the case where an arm of the converter arm U1, X1, U2, or X2 or the converter arm W1, Z1, W2, or Z2 is conducting, the protection gate output function having a gate pulse for when partial commutation failure occurs is lost; and in some cases, there is a possibility that the thyristors included in the converter arm may be damaged. Accordingly, even in the case of the power interruption, for example, even if the protection gate output function is lost after the converter arms are completely turned off, the likelihood of damage of the thyristors included in the converter arm can be reduced. For example, in it is sufficient to ensure a half cycle of the system frequency as the power interruption compensation time. The time of a half cycle is, for example, about 10 milliseconds (ms) when the system frequency is 50 Hz.

Here, it is assumed that the first control power supply 11a of the first control circuit 11 fails and the first control circuit 11 has a power interruption; and the bypass pair command BP2 is output from the higher-level control circuit 14 to the second control circuit 12 to set the converter arms V1, Y1, V2, and Y2 to the bypass pair state. Instead, a bypass pair command BP3 may be output from the higher-level control circuit 14 to the third control circuit 13 to set the converter arms W1, Z1, W2, and Z2 to the bypass pair state; and the output of the phase control pulse PHS from the higher-level control circuit 14 to the second control circuit 12 may be stopped.

This is similar also for the case where the second control circuit 12 or the third control circuit 13 has a power interruption. For example, the converter arms U1, X1, U2, and X2 are set to the bypass pair state. In such a case, a bypass pair command BP1 is output from the higher-level control circuit 14 to the first control circuit 11.

Figure 6A:
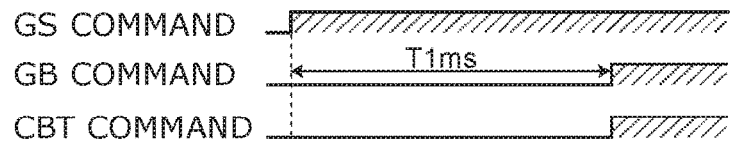
FIG. 6A and FIG. 6B are timing charts illustrating protective stop operation of the power conversion device.
Figure 6B:
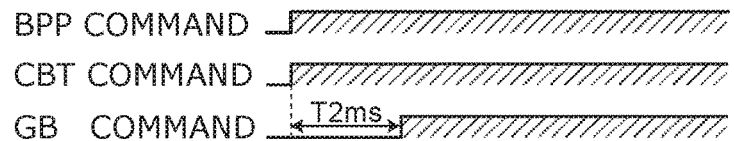

FIG. 6A and FIG. 6B are timing charts illustrating protective stop operations of the power conversion devices.

FIG. 6A is a timing chart showing the protective stop operation in the case where a gate shift according to a reference example is used.

FIG. 6B is a timing chart showing the protective stop operation in the case where the bypass pairs according to the embodiment are used.

GS is the gate shift in the drawings. GB is the gate block. CBT is the CB (circuit breaker) trip. BPP is the bypass pairs.

As illustrated in FIG. 6A, a time of about T1 (ms) is necessary to complete the GS operation in the case where the protective stop operation is performed by "GS-GB-CBT." That is, it is necessary to ensure T1 (ms) or more as the power interruption compensation time. Although T1 is dependent on the inductance and/or the gate shift phase of the direct current circuit, T1 generally is about 40 ms to 100 ms. In such a case, it is necessary to ensure at least 40 ms or more as the power interruption compensation time.

Conversely, according to the embodiment as illustrated in FIG. 6B, the protective stop operation is performed by "BPP-CBT-GB." In such a case, a time of T2 (ms) that is shorter than T1 is sufficient to complete the BPP operation. That is, it is sufficient to ensure T2 (ms) or more as the power interruption compensation time. T2 is, for example, the time of a half cycle of the system frequency of 50 Hz and is about 10 ms. In such a case, it is sufficient to ensure 10 ms or more as the power interruption compensation time. More desirably, including a margin, for example, it is favorable to be 20 ms or more.

Thus, according to the embodiment, by combining and including the power interruption compensation circuits for each of the control circuits, and by further employing a protective stop operation using bypass pairs, the protective stop operation can be performed rapidly compared to the protective stop operation using a gate shift; further, because the power interruption compensation time can be short, a longer life and a smaller capacity are possible for the power interruption compensation circuit.

Second Embodiment

The case is described in the first embodiment where the control power supply of at least one of the first to third control circuits 11 to 13 is lost.

A case will now be described where at least one of the first to third control circuits 11 to 13 fails and cannot output the gate pulses.

Here, in FIG. 4 and FIG. 5, the case is assumed where the first gate pulse generation circuit 11*d* fails due to some cause and cannot output the gate pulse GU1. In such a case, the abnormality (the open phase) of the first gate pulse generation circuit 11*d* is sensed by the first pulse monitor circuit 11*f* and transmitted as an abnormality signal to the first OR circuit 11*g*. The abnormality signal is notified as the failure signal F1 from the first control circuit 11 to the higher-level control circuit 14 via the first OR circuit 11*g*.

The higher-level control circuit 14 that receives the notification immediately outputs the bypass pair command to one control circuit other than the first control circuit 11. Also, the output of the phase control pulses PHS is stopped for the first control circuit 11 and the control circuit to which the bypass pair command is not output.

Thereafter, the operation is similar to the operation described above when it is assumed that the first control power supply 11*a* of the first control circuit 11 fails and the first control circuit 11 has the power interruption; and a description is therefore omitted.

In the case of this failure, instead of a power interruption, the first control power supply 11*a* of the first gate pulse generation circuit 11*d* is maintained. Therefore, the gate pulses other than the failed gate pulse GU1 are in an outputtable state. In the case where only such a failure is assumed, the first to third control circuits 11 to 13 may not respectively include the first to third power interruption detection circuits 11*b*, 12*b*, and 13*b* and the first to third power interruption compensation circuits 11*c*, 12*c*, and 13*c*.

Although the power interruption detection circuit and the pulse monitor circuit are provided inside each of the first to third control circuits 11 to 13 in the embodiment, it is sufficient for the failure detection circuit 14*b* to be able to sense in which circuit of the first to third control circuits 11 to 13 the abnormality occurred. Therefore, a circuit that performs some failure monitor of the first to third control circuits 11 to 13 may be provided on the higher-level control circuit 14 side.

Figure 7:
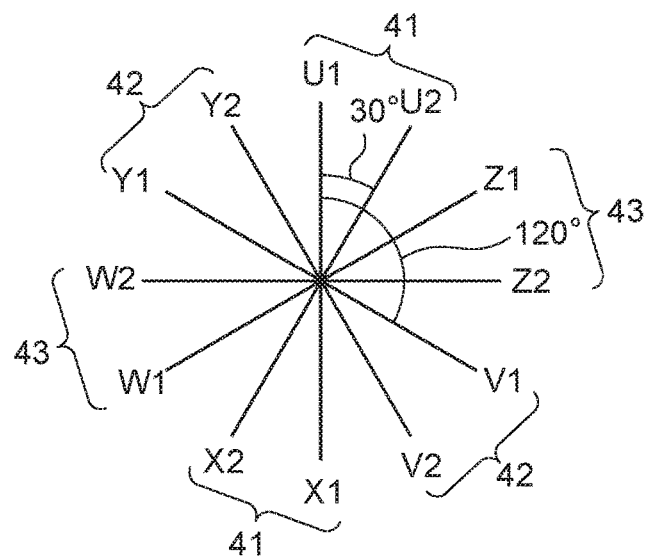
FIG. 7 is a drawing illustrating the relationship between the phase angles of the converter arms according to the second embodiment.

FIG. 7 is a drawing illustrating the relationship between the phase angles of the converter arms according to the second embodiment.

As illustrated in FIG. 7, in the case of the first switching circuit 41, the phases of the converter arms U2 and X2 are shifted 30° with respect to the phases of the converter arms U1 and X1. In the case of the second switching circuit 42, the phases of the converter arms V2 and Y2 are shifted 30° with respect to the phases of the converter arms V1 and Y1. In the case of the third switching circuit 43, the phases of the converter arms W2 and Z2 are shifted 30° with respect to the phases of the converter arms W1 and Z1. The converter arms U1 and X1, the converter arms V1 and Y1, and the converter arms W1 and Z1 are shifted 120° from each other.

In the case where the first control circuit 11 fails, bypass pairs are configured using multiple converter arms (V1, Y1, V2, Y2, W1, Z1, W2, and Z2) other than the multiple converter arms U1, X1, U2, and X2. In the case where the second control circuit 12 fails, bypass pairs are configured using multiple converter arms (U1, X1, U2, X2, W1, Z1, W2, and Z2) other than the multiple converter arms V1, Y1, V2, and Y2. In the case where the third control circuit 13 fails, bypass pairs are configured using multiple converter arms (U1, X1, U2, X2, V1, Y1, V2, and Y2) other than the multiple converter arms W1, Z1, W2, and Z2.

FIG. 8 is a figure illustrating combinations of bypass pairs according to the second embodiment.

As illustrated in FIG. 8, there are four cases of combinations for each of the R-phase, the S-phase, and the T-phase. That is, in the case where the first control circuit 11 fails for the R-phase, there are the four cases of "V1, Y1, V2, and Y2," "V1, Y1, W2, and Z2," "W1, Z1, V2, and Y2," and "W1, Z1, W2, and Z2." In the case where the second control circuit 12 fails for the S-phase, there are the four cases of "U1, X1, U2, and X2," "U1, X1, W2, and Z2," "W1, Z1, U2, and X2," and "W1, Z1, W2, and Z2." In the case where the third control circuit 13 fails for the T-phase, there are the four cases of "U1, X1, U2, and X2," "U1, X1, V2, and Y2," "V1, Y1, U2, and X2," and "V1, Y1, V2, and Y2."

Thus, in the embodiment, even in the case where one of the first to third control circuits 11 to 13 fails, it is possible to output the gate pulses from a control circuit that has not failed and to configure bypass pairs using converter arms other than the multiple converter arms of the failed control circuit. Thereby, the AC-DC converter can be stopped safely without the failure of one control circuit affecting the entirety.

According to the embodiments, a control device of a power conversion device can be provided in which the circuit configuration can be simple.

Hereinabove, embodiments of the invention are described with reference to specific examples. However, the invention is not limited to these specific examples. For example, one skilled in the art may similarly practice the invention by appropriately selecting specific configurations of components such as the first control circuit, the first power interruption compensation circuit, the second control circuit, the second power interruption compensation circuit, the third control circuit, the third power interruption compensation circuit, etc., from known art; and such practice is within the scope of the invention to the extent that similar effects can be obtained.

Also, any two or more components of the specific examples may be combined within the extent of technical feasibility and are within the scope of the invention to the extent that the spirit of the invention is included.

Further, all control devices of power conversion devices practicable by an appropriate design modification by one skilled in the art based on the control devices of the power conversion devices described above as the embodiments of the invention also are within the scope of the invention to the extent that the spirit of the invention is included.

Further, various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A control device of a power conversion device converting alternating current power into direct current power and supplying the direct current power to a direct current circuit, the alternating current power being supplied from an alternating current power supply, the power conversion device being separately-excited and including a first switching circuit, a second switching circuit, and a third switching circuit, the first switching circuit including a first converter arm and a second converter arm connected in series at a first alternating current connection point, the second switching circuit including a third converter arm and a fourth converter arm connected in series at a second alternating connection point, the third switching circuit including a fifth converter arm and a sixth converter arm connected in series at a third alternating current connection point, the first alternating current connection point capable to be connected to a first phase of the alternating current power, the second alternating current connection point capable to be connected to a second phase of the alternating current power, the third alternating current connection point capable to be connected to a third phase of the alternating current power, one end of the first switching circuit, one end of the second switching circuit, and one end of the third switching circuit capable to be connected to a high-voltage side of the direct current circuit, another end of the first switching circuit, another end of the second switching circuit, and another end of the third switching circuit capable to connected to a low-voltage side of the direct current circuit, the control device comprising:
a first control circuit controlling a gate pulse of each of the first converter arm and the second converter arm included in the first switching circuit;
a second control circuit controlling a gate pulse of each of the third converter arm and the fourth converter arm included in the second switching circuit; and
a third control circuit controlling a gate pulse of each of the fifth converter arm and sixth converter arm included in the third switching circuit,
the first control circuit including a first power interruption compensation circuit supplying electrical power to the first control circuit for a prescribed amount of time during a power interruption of the first control circuit,
the second control circuit including a second power interruption compensation circuit supplying electrical power to the second control circuit for a prescribed amount of time during a power interruption of the second control circuit, and
the third control circuit including a third power interruption compensation circuit supplying electrical power to the third control circuit for a prescribed amount of time during a power interruption of the third control circuit.

2. The control device of the power conversion device according to claim 1, further comprising:
a higher-level control circuit connected to each of the first control circuit, the second control circuit, and the third control circuit;
a first abnormality detection circuit sensing an abnormality of the first control circuit;
a second abnormality detection circuit sensing an abnormality of the second control circuit; and
a third abnormality detection circuit sensing an abnormality of the third control circuit,
when normal, the higher-level control circuit outputs, to the first control circuit, a phase control pulse of each of the plurality of first converter arms included in the first switching circuit, and outputs, to the second control circuit, a phase control pulse of each of the plurality of second converter arms included in the second switching circuit, and outputs, to the third control circuit, a phase control pulse of each of the plurality of third converter arms included in the third switching circuit,
in the case where a signal is received from the first abnormality detection circuit, the higher-level control circuit stops the output of the phase control pulse to the first control circuit and outputs, to the second control circuit and the third control circuit, a first bypass pair command causing at least one of the second switching circuit or the third switching circuit to a bypass pair state, the first bypass pair command causing the third converter arm and the fourth converter arm to conduct simultaneously or the fifth converter arm and the sixth converter arm to conduct simultaneously,
in the case where a signal is received from the second abnormality detection circuit, the higher-level control circuit stops the output of the phase control pulse to the second control circuit and outputs, to the first control circuit and the third control circuit, a second bypass pair command causing at least one of the first switching circuit or the third switching circuit to a bypass pair state, the second bypass pair command causing the first converter arm and the second converter arm to conduct simultaneously or the fifth converter arm and the sixth converter arm to conduct simultaneously,
in the case where a signal is received from the third abnormality detection circuit, the higher-level control circuit stops the output of the phase control pulse to the third control circuit and outputs, to the first control circuit and the second control circuit, a third bypass pair command causing at least one of the first switching circuit or the second switching circuit to a bypass pair state, the third bypass pair command causing the first converter arm and the second converter arm to conduct simultaneously or the third converter arm and the fourth converter arm to conduct simultaneously.

3. The control device of the power conversion device according to claim 2, wherein the prescribed amount of time is not less than a time from when the bypass pair command is output until one of the first converter arm, the second converter arm, or the third converter arm not receiving the bypass pair command turns off.

4. The control device of the power conversion device according to claim 3, wherein
the first control circuit further includes a first control power supply supplying a power supply to the first control circuit,
the first abnormality detection circuit further has a function of sensing the power interruption of the first control circuit by monitoring a state of the first control power supply,
the second control circuit further includes a second control power supply supplying a power supply to the second control circuit,
the second abnormality detection circuit further has a function of sensing the power interruption of the second control circuit by monitoring a state of the second control power supply,
the third control circuit further includes a third control power supply supplying a power supply to the third control circuit, and
the third abnormality detection circuit further has a function of sensing the power interruption of the third control circuit by monitoring a state of the third control power supply.

5. The control device of the power conversion device according to claim 4, wherein
the first abnormality detection circuit further has a function of sensing an abnormality of the gate pulses of the first control circuit by monitoring a state of the gate pulses of the first control circuit,
the second abnormality detection circuit further has a function of sensing an abnormality of the gate pulses of the second control circuit by monitoring a state of the gate pulses of the second control circuit, and
the third abnormality detection circuit further has a function of sensing an abnormality of the gate pulses of the third control circuit by monitoring a state of the gate pulses of the third control circuit.

6. The control device of the power conversion device according to claim 3, wherein
the first abnormality detection circuit further has a function of sensing an abnormality of the gate pulses of the first control circuit by monitoring a state of the gate pulses of the first control circuit,
the second abnormality detection circuit further has a function of sensing an abnormality of the gate pulses of the second control circuit by monitoring a state of the gate pulses of the second control circuit, and
the third abnormality detection circuit further has a function of sensing an abnormality of the gate pulses of the third control circuit by monitoring a state of the gate pulses of the third control circuit.

7. The control device of the power conversion device according to claim 2, wherein
the first control circuit further includes a first control power supply supplying a power supply to the first control circuit,
the first abnormality detection circuit further has a function of sensing the power interruption of the first control circuit by monitoring a state of the first control power supply,
the second control circuit further includes a second control power supply supplying a power supply to the second control circuit,
the second abnormality detection circuit further has a function of sensing the power interruption of the second control circuit by monitoring a state of the second control power supply,
the third control circuit further includes a third control power supply supplying a power supply to the third control circuit, and
the third abnormality detection circuit further has a function of sensing the power interruption of the third control circuit by monitoring a state of the third control power supply.

8. The control device of the power conversion device according to claim 7, wherein
the first abnormality detection circuit further has a function of sensing an abnormality of the gate pulses of the first control circuit by monitoring a state of the gate pulses of the first control circuit,
the second abnormality detection circuit further has a function of sensing an abnormality of the gate pulses of the second control circuit by monitoring a state of the gate pulses of the second control circuit, and
the third abnormality detection circuit further has a function of sensing an abnormality of the gate pulses of the third control circuit by monitoring a state of the gate pulses of the third control circuit.

9. The control device of the power conversion device according to claim 2, wherein
the first abnormality detection circuit further has a function of sensing an abnormality of the gate pulses of the first control circuit by monitoring a state of the gate pulses of the first control circuit,
the second abnormality detection circuit further has a function of sensing an abnormality of the gate pulses of the second control circuit by monitoring a state of the gate pulses of the second control circuit, and
the third abnormality detection circuit further has a function of sensing an abnormality of the gate pulses of the third control circuit by monitoring a state of the gate pulses of the third control circuit.

10. A control device of a power conversion device converting alternating current power into direct current power and supplying the direct current power to a direct current circuit, the alternating current power being supplied from an alternating current power supply, the power conversion device being separately-excited and including a first switching circuit, a second switching circuit, and a third switching circuit, the first switching circuit including a first converter arm and a second converter arm connected in series at a first alternating current connection point, the second switching circuit including a third converter arm and a fourth converter arm connected in series at a second alternating current connection point, the third switching circuit including a fifth converter arm and a sixth converter arm connected in series at a third alternating current connection point, the first alternating current connection point capable to be connected to a first phase of the alternating current power, the second alternating current connection point capable to be connected to a second phase of the alternating current power, the third alternating current connection point capable to be connected to a third phase of the alternating current power, one end of the first switching circuit, one end of the second switching circuit, and one end of the third switching circuit capable to be connected to a high-voltage side of the direct current circuit, another end of the first switching circuit, another end of the second switching circuit, and another end of the third switching circuit capable to be connected to a low-voltage side of the direct current circuit, the control device of the power conversion device comprising:
- a first control circuit controlling an on-timing of each of the first converter arm and the second converter arm connected to the first switching circuit;
- a second control circuit controlling an on-timing of each of the third converter arm and the fourth converter arm connected to the second switching circuit;
- a third control circuit controlling an on-timing of each of the fifth converter arm and the sixth converter arm connected to the third switching circuit; and
- a higher-level control circuit connected to each of the first control circuit, the second control circuit, and the third control circuit,
- when a failure of the first control circuit is sensed, the higher-level control circuit outputs, to the second control circuit and the third control circuit, a first bypass pair command causing at least one of the second switching circuit and the third switching circuit to a bypass pair state, the first bypass pair command causing the third converter arm and the fourth converter arm to conduct simultaneously or the fifth converter arm and the sixth converter arm to conduct simultaneously,
- when a failure of the second control circuit is sensed, the higher-level control circuit outputs, to the first control circuit and the third control circuit, a second bypass pair command causing at least one of the first switching circuit and the third switching circuit to a bypass pair state, the second bypass pair command causing the first converter arm and the second converter arm to conduct simultaneously or the fifth converter arm and the sixth converter arm to conduct simultaneously, and
- when a failure of the third control circuit is sensed, the higher-level control circuit outputs, to the first control circuit and the second control circuit, a third bypass pair command causing at least one of the first switching circuit and the second switching circuit to a bypass pair state, the third bypass pair command causing the first converter arm and the second converter arm to conduct simultaneously or the third converter arm and the fourth converter arm to conduct simultaneously.

* * * * *